(12) United States Patent
Nakatsuka et al.

(10) Patent No.: US 6,433,458 B2
(45) Date of Patent: Aug. 13, 2002

(54) METHOD AND UNIT FOR DRIVING PIEZOELECTRIC TRANSFORMER USED FOR CONTROLLING LUMINANCE OF COLD-CATHODE TUBE

(75) Inventors: Hiroshi Nakatsuka; Katsunori Moritoki, both of Osaka; Toshiyuki Asahi, Hyogo; Kojiro Okuyama, Nara; Osamu Kawasaki, Kyoto, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/834,820

(22) Filed: Apr. 13, 2001

(30) Foreign Application Priority Data

Apr. 27, 2000 (JP) ........................................ 2000-127444

(51) Int. Cl.[7] .............................................. H01L 41/08
(52) U.S. Cl. ............. 310/316.01; 310/317; 315/209 PZ
(58) Field of Search ........................ 310/316.01, 317, 310/319, 359, 366

(56) References Cited

U.S. PATENT DOCUMENTS 5,705,879 A * 1/1998 Abe et al. ..................... 310/359
6,013,969 A * 1/2000 Noma et al. ............. 310/316.01
6,087,757 A   4/2000 Hondo et al.
6,075,325 A * 6/2000 Kouno et al. ......... 315/209 PZ

FOREIGN PATENT DOCUMENTS

JP    11-8087      1/1999
JP    11-27955     1/1999

* cited by examiner

*Primary Examiner*—Mark O. Budd
(74) *Attorney, Agent, or Firm*—Merchant & Gould PC

(57) ABSTRACT

A method and unit for driving a small high-efficiency piezoelectric transformer allowing a cold-cathode tube to have stable luminance by detecting only an active current flowing in the cold-cathode tube based on a phase difference between an output current and voltage of the piezoelectric transformer, removing a reactive current caused by stray capacitance formed between the cold-cathode tube and a reflector, and accurately controlling driving of the piezoelectric transformer so that a constant active current is detected.

8 Claims, 16 Drawing Sheets

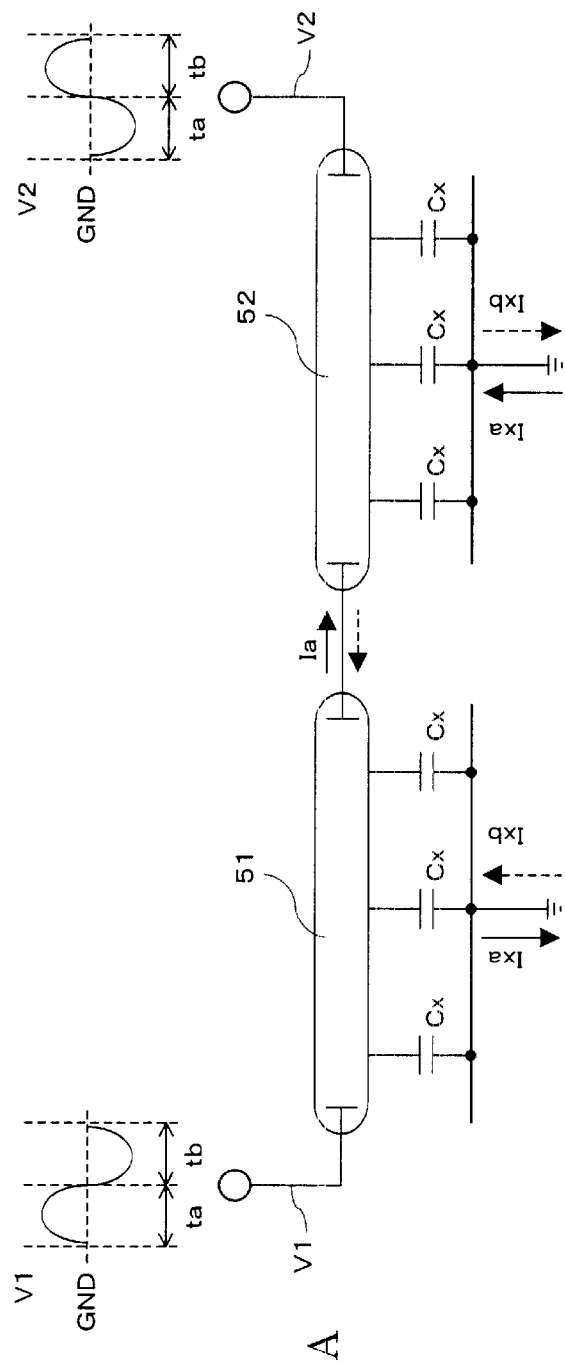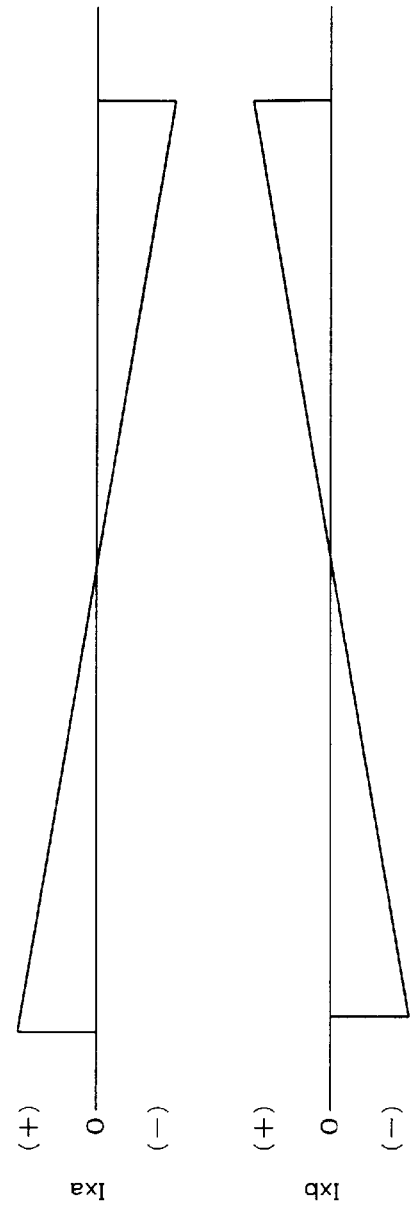
FIG. 13A
FIG. 13B
FIG. 13C
(PRIOR ART)

METHOD AND UNIT FOR DRIVING PIEZOELECTRIC TRANSFORMER USED FOR CONTROLLING LUMINANCE OF COLD-CATHODE TUBE

BACKGROUND OF THE INVENTION

1. Field of the Invention

The present invention relates generally to a method and unit for driving a piezoelectric transformer used in various high-voltage transformer assemblies.

2. Related Background Art

FIG. 14 shows a configuration of a Rosen-type piezoelectric transformer that is a typical configuration of conventional piezoelectric transformers. This piezoelectric transformer has advantages of, for example, having a smaller size than that of an electromagnetic transformer, being incombustible, and generating no noise caused by electromagnetic induction.

In FIG. 14, a portion indicated with numeral 1 is a low impedance portion of the piezoelectric transformer and functions as an input part when the piezoelectric transformer is used for voltage step-up. The low impedance portion 1 is polarized in the thickness direction (PD), and electrodes 3U and 3D are disposed on its principal planes in the thickness direction. On the other hand, a portion indicated with a numeral 2 is a high impedance portion and functions as an output part when the piezoelectric transformer is used for voltage step-up. The high impedance portion 2 is polarized in the longitudinal direction (PL) and an electrode 4 is disposed on an end face in the longitudinal direction.

A piezoelectric transformer as shown in FIG. 14 has characteristics that a very high step-up ratio can be obtained under an infinite load and the step-up ratio decreases with reduction in load. Due to those characteristics, recently such a piezoelectric transformer has been used as a power supply for a cold-cathode tube. An inverter with a piezoelectric transformer can generate a high voltage efficiently.

FIG. 15 is a block diagram showing a configuration of a conventional self-oscillation type drive for a piezoelectric transformer. In FIG. 15, numeral 13 indicates a variable oscillation circuit for producing a variable-frequency voltage signal. A voltage signal output from the variable oscillation circuit 13 generally has a pulse waveform. A high-frequency component in the voltage signal is removed by a wave shaping circuit 11 and thus the voltage signal is converted into an AC signal with a substantially sinusoidal waveform. An output signal from the wave shaping circuit 11 is converted to a voltage, the voltage is amplified to a sufficient level to drive a piezoelectric transformer 10 by a drive circuit 12, and then the voltage thus amplified is input to one primary side electrode 3U of the piezoelectric transformer 10. The other primary side electrode 3D of the piezoelectric transformer 10 is connected to a ground potential. A voltage stepped up by a piezoelectric effect of the piezoelectric transformer 10 is output from the secondary side electrode 4.

A high voltage output from the secondary side electrode is applied to a series circuit including a cold-cathode tube 17 and a feedback resistance 18 and to an overvoltage protection circuit section 20. The overvoltage protection circuit section 20 includes resistances 19a and 19b and a comparing circuit 15. The comparing circuit 15 compares a voltage obtained through division by the resistances 19a and 19b with a reference voltage Vref1. The comparing circuit 15 outputs a signal to an oscillation control circuit 14 so that the high voltage output from the secondary side electrode 4 of the piezoelectric transformer is prevented from rising beyond a preset voltage determined depending on the reference voltage Vref1. This overvoltage protection circuit section 20 does not operate during emission by the cold-cathode tube 17.

A voltage generated at both ends of the feedback resistance 18 by a current flowing in the series circuit including the cold-cathode tube 17 and the feedback resistance 18 is applied to one input terminal of a comparing circuit 16 as a feedback voltage. The comparing circuit 16 compares the feedback voltage with a reference voltage Vref2 applied to the other input terminal and sends a signal to the oscillation control circuit 14 so that a substantially constant current flows in the cold-cathode tube 17.

The oscillation control circuit 14 outputs a signal to the variable oscillation circuit 13 to allow the variable oscillation circuit 13 to oscillate at a frequency corresponding to the output signal from the comparing circuit 16. This comparing circuit 16 does not operate before a start of emission by the cold-cathode tube 17.

Thus, the cold-cathode tube 17 emits light stably. In the case where the piezoelectric transformer is driven by a self-oscillation system, even when the resonance frequency of the piezoelectric transformer varies depending on temperatures, a drive frequency automatically follows the resonance frequency.

As described above, an inverter with a configuration using a piezoelectric transformer allows driving of the piezoelectric transformer to be controlled so that a constant current flows in the cold-cathode tube 17.

In order to prevent variations in luminance of the cold-cathode tube, for example, the following drive methods have been proposed. In one driving method, as shown in FIG. 9, two piezoelectric transformers 22 and 23 are driven in parallel with each other and a cold-cathode tube 21 is allowed to emit light with two AC voltage signals V1 and V2 whose phases are different from each other by 180°. In another driving method, using a piezoelectric transformer 61 with a configuration shown in FIG. 10, two output electrodes 4L and 4R of the piezoelectric transformer 61 are connected to two input terminals 641 and 642 of a cold-cathode tube 64, respectively, as shown in FIG. 11.

In such drives, in an operation carried out in the drive shown in FIG. 15, it is necessary to feedback a current flowing in the cold-cathode tube to control the frequency and voltage. Alternatively, feedback is carried out through detection of luminance of the cold-cathode tube.

In order to obtain a constant luminance of the cold-cathode tube, a current flowing in the cold-cathode tube is controlled through detection of an output current or voltage of the piezoelectric transformer (for example, by the output current detecting circuit 24 or the output voltage comparing circuit 25 shown in FIG. 9) or through detection of a current flowing in a reflector.

In the conventional drives for a piezoelectric transformer described above, the current flowing in the cold-cathode tube is controlled by the feedback of a voltage detected by the feedback resistance 18 (FIG. 15) connected to the cold-cathode tube.

However, due to stray capacitance Cx (FIGS. 9 and 11) between a cold-cathode tube and a reflector (a reflector 26 shown in FIG. 9, a reflector 65 shown in FIG. 11), a current flows out to the reflector from the cold-cathode tube. As a result, there has been a problem of variations in, luminance of the cold-cathode tube.

In order to solve this problem, JP 11(1999)-8087 A proposes a means for inputting voltages whose phases are different by 180° from respective ends of a cold-cathode tube. As shown in FIG. 12A, however, when voltages are applied to one cold-cathode tube 51 as shown in FIG. 12A or to two cold-cathode tubes 51 and 52 connected with each other in series as shown in FIG. 13A, a current flows out from the cold-cathode tube to the reflector (a current Ixa on the (+) side shown in FIG. 12B and a current Ixb on the (+) side shown in FIG. 12C) on a higher-voltage side (the side to which a voltage V1 is applied during a period ta, the side to which a voltage V2 is applied during a period tb). On the other hand, a current flows into the cold-cathode tube from the reflector (a current Ixa on the (−) side shown in FIG. 12B and a current Ixb on the (−) side shown in FIG. 12C) on a lower-voltage side (the side to which a voltage V1 is applied during a period tb, the side to which a voltage V2 is applied during a period ta).

Therefore, an output current from the piezoelectric transformer contains both a current Ia flowing only in the cold-cathode tube and leakage currents Ixa and Ixb (Ix) flowing in the stray capacitance Cx. During emission by the cold-cathode tube, the cold-cathode tube is handled as a resistive load. Therefore, a current participating in the luminance of the cold-cathode tube is only an active current $Ia=I\cos\theta$ ($\theta$ indicates a phase difference between an output voltage and an output current from the piezoelectric transformer as shown in FIG. 16) of a current (I) output from the piezoelectric transformer. In other words, the leakage current Ix flowing in the reflector through the stray capacitance Cx becomes a reactive current and thus does not participate in the luminance of the cold-cathode tube.

Hence, in the drives for a piezoelectric transformer with the configurations as shown in FIGS. 9 and 11, the output current detecting circuit 24, 62 detects the current Ia flowing in the cold-cathode tube together with the leakage current Ix caused by the stray capacitance Cx formed by, for example, the cold-cathode tube and the reflector. If the stray capacitance Cx formed by the reflector were constant, the current flowing in the cold-cathode tube would be controlled to be constant with consideration given to the constant capacitance Cx. However, the stray capacitance Cx varies and it therefore is difficult to control the current Ia flowing in the cold-cathode tube so that the current Ia is constant. This causes variations in luminance among inverters, or the like. In addition, similarly in the case of a drive with two piezoelectric transformers, it is difficult to control a tube current.

In JP 11(1999)-27955 A, a leakage current and a tube current are detected by a stray capacitance current detecting circuit and a tube current detecting circuit, respectively, and thus a tube current is controlled. In the method disclosed in JP 11(1999)-27955 A, however, in a piezoelectric transformer allowing an output voltage to be constant by control of a drive frequency, the impedance depending on stray capacitance varies when the frequency of a leakage current caused by the stray capacitance varies. Accordingly, the magnitude of the leakage current varies. As a result, when a circuit is intended to be configured with consideration also given to an influence of the frequency, a complicated control circuit is required.

SUMMARY OF THE INVENTION

Therefore, with the foregoing in mind, it is an object of the present invention to provide a method and unit for driving a small high-efficiency piezoelectric transformer allowing a cold-cathode tube to have a stable luminance through removal of an influence of a reactive current as a leakage current caused by stray capacitance between the cold-cathode tube and a reflector and through accurate control to obtain a constant tube current.

In order to achieve the above-mentioned object, a first method of driving a piezoelectric transformer according to the present invention includes: stepping up a voltage input from a primary terminal of a piezoelectric transformer by using a piezoelectric effect and outputting a voltage stepped up by using the piezoelectric effect to two terminals of a cold-cathode tube from two secondary terminals of the piezoelectric transformer; detecting a phase difference between the voltage applied to the cold-cathode tube and a current flowing in the cold-cathode tube; detecting an active current flowing in the cold-cathode tube based on the phase difference; comparing the active current with a predetermined set value; and controlling the driving of the piezoelectric transformer so that the active current flowing in the cold-cathode tube has a value equal to the predetermined set value.

In order to achieve the above-mentioned object, a second method of driving piezoelectric transformers according to the present invention includes: inputting a voltage from a primary terminal of a first piezoelectric transformer by using a piezoelectric effect and outputting a voltage stepped up by using the piezoelectric effect to one terminal of a cold-cathode tube from a secondary terminal of the first piezoelectric transformer; inputting a voltage from a primary terminal of a second piezoelectric transformer by using the piezoelectric effect and outputting a voltage stepped up by using the piezoelectric effect to the other terminal of the cold-cathode tube from a secondary terminal of the second piezoelectric transformer; detecting a phase difference between the voltage applied to the cold-cathode tube and a current flowing in the cold-cathode tube; detecting an active current flowing in the cold-cathode tube based on the phase difference; comparing the active current with a predetermined set value; and controlling driving of the first and second piezoelectric transformers so that the active current flowing in the cold-cathode tube has a value equal to the predetermined set value.

In the first and second driving methods, preferably, the cold-cathode tube includes one or more cold-cathode tubes connected in series.

In order to achieve the above-mentioned object, a first drive for a piezoelectric transformer according to the present invention includes: a piezoelectric transformer for inputting a voltage from its primary terminal by using a piezoelectric effect and outputting a voltage stepped up by using the piezoelectric effect from its two secondary terminals; a drive circuit for driving the piezoelectric transformer; a variable oscillation circuit for outputting a variable-frequency voltage to the drive circuit; a cold-cathode tube with two terminals to which the voltage output from the two secondary terminals of the piezoelectric transformer is applied; a current detecting circuit for detecting a current flowing in the cold-cathode tube; a voltage detecting circuit for detecting the voltage applied to the cold-cathode tube; a phase difference detecting circuit for detecting a phase difference between a current signal output from the current detecting circuit and a voltage signal output from the voltage detecting circuit; an active current detecting circuit for detecting an active current flowing in the cold-cathode tube based on the current signal output from the current detecting circuit and the phase difference detected in the phase difference detecting circuit; and an oscillation control circuit for comparing the active current detected in the active current detecting circuit with a predetermined set value and controlling an oscillation frequency of the variable oscillation circuit so that the active current has a value equal to the predetermined set value.

In order to achieve the above-mentioned object, a second drive for piezoelectric transformers according to the present invention includes: a first piezoelectric transformer for inputting a voltage from its primary terminal by using a piezoelectric effect and outputting a voltage stepped up by using the piezoelectric effect from its secondary terminal; a second piezoelectric transformer for inputting a voltage from its primary terminal by using the piezoelectric effect and outputting a voltage stepped up by using the piezoelectric effect from its secondary terminal; drive circuits for driving the first and second piezoelectric transformers with signals whose phases are different from each other by 180°, respectively; variable oscillation circuits for outputting variable-frequency voltages to the drive circuits, respectively; a cold-cathode tube with one terminal to which the voltage output from the secondary terminal of the first piezoelectric transformer is applied and the other terminal to which the voltage output from the secondary terminal of the second piezoelectric transformer is applied; a current detecting circuit for detecting a current flowing in the cold-cathode tube; a voltage detecting circuit for detecting the voltage applied to the cold-cathode tube; a phase difference detecting circuit for detecting a phase difference between a current signal output from the current detecting circuit and a voltage signal output from the voltage detecting circuit; an active current detecting circuit for detecting an active current flowing in the cold-cathode tube based on the current signal output from the current detecting circuit and the phase difference detected in the phase difference detecting circuit; and an oscillation control circuit for comparing the active current detected in the active current detecting circuit with a predetermined set value and controlling oscillation frequencies of the variable oscillation circuits so that the active current has a value equal to the predetermined set value.

In order to achieve the above-mentioned object, a third method of driving piezoelectric transformers according to the present invention includes: inputting a voltage from a primary terminal of a first piezoelectric transformer by using a piezoelectric effect and outputting a voltage stepped up by using the piezoelectric effect to one terminal of a cold-cathode tube from a secondary terminal of the first piezoelectric transformer; inputting, by using the piezoelectric effect, a voltage from a primary terminal of a second piezoelectric transformer having a phase identical with that of the voltage input to the first piezoelectric transformer, and outputting a voltage stepped up by using the piezoelectric effect having a different phase from that of the voltage output from the first piezoelectric transformer by 180° to the other terminal of the cold-cathode tube from a secondary terminal of the second piezoelectric transformer; and allowing the cold-cathode tube to emit light.

Preferably, the third driving method further includes: detecting a phase difference between the voltage applied to the cold-cathode tube and a current flowing in the cold-cathode tube; detecting an active current flowing in the cold-cathode tube based on the phase difference; comparing the active current with a predetermined set value; and controlling driving of the first and second piezoelectric transformers so that the active current flowing in the cold-cathode tube has a value equal to the predetermined set value.

In order to achieve the above-mentioned object, a third drive for piezoelectric transformers according to the present invention includes: a first piezoelectric transformer for inputting a voltage from its primary terminal by using a piezoelectric effect and outputting a voltage stepped up by using the piezoelectric effect from its secondary terminal; a second piezoelectric transformer for inputting, by using the piezoelectric effect, a voltage from its primary terminal having a phase identical with that of the voltage input to the first piezoelectric transformer, and outputting, from its secondary terminal, a voltage stepped up by using the piezoelectric effect having a different phase from that of the voltage output from the first piezoelectric transformer by 180°; drive circuits for driving the first and second piezoelectric transformers with signals whose phases are identical with each other, respectively; a variable oscillation circuit for outputting a variable-frequency voltage to the drive circuits; a cold-cathode tube with one terminal to which the voltage output from the secondary terminal of the first piezoelectric transformer is applied and the other terminal to which the voltage output from the secondary terminal of the second piezoelectric transformer is applied; a current detecting circuit for detecting a current flowing in the cold-cathode tube; a voltage detecting circuit for detecting the voltage applied to the cold-cathode tube; a phase difference detecting circuit for detecting a phase difference between a current signal output from the current detecting circuit and a voltage signal output from the voltage detecting circuit; an active current detecting circuit for detecting an active current flowing in the cold-cathode tube based on the current signal output from the current detecting circuit and the phase difference detected in the phase difference detecting circuit; and an oscillation control circuit for comparing the active current detected in the active current detecting circuit with a predetermined set value and controlling an oscillation frequency of the variable oscillation circuit so that the active current has a value equal to the predetermined set value.

In order to achieve the above-mentioned object, a fourth drive for piezoelectric transformers according to the present invention includes: a pair of current amplifying circuits for amplifying currents converted from AC voltages input thereto having different phases from each other by 180°, respectively; a pair of step-up transformers for amplifying voltages converted from signals output from the pair of current amplifying circuits and outputting voltage signals whose phases are different from each other by 180°, respectively; and a pair of piezoelectric transformers each of which includes a piezoelectric body in which a primary side electrode and a secondary side electrode are formed, steps up the voltage signal input to the primary side electrode from one of the pair of step-up transformers, and outputs a voltage signal stepped up from the secondary side electrode.

According to the configurations described above, only an active current flowing in the cold-cathode tube is detected based on the phase difference between an output current and voltage of a piezoelectric transformer, a reactive current caused by the stray capacitance formed between the cold-cathode tube and a reflector can be removed, and the driving of the piezoelectric transformer is controlled accurately so that a constant tube current is obtained. Thus, there can be provided a method and unit for driving a small high-efficiency piezoelectric transformer allowing the cold-cathode tube to have a stable luminance.

BRIEF DESCRIPTION OF THE DRAWINGS

FIG. 13A is a schematic diagram showing leakage currents Ixa and Ixb caused by stray capacitance Cx when voltages whose phases are different from each other by 180° are applied to ends of two cold-cathode tubes connected to each other in series, respectively.

FIG. 13B is a diagram showing a magnitude and direction of the leakage current Ixa with respect to a length direction in the cold-cathode tubes during a period ta shown in FIG. 13A.

FIG. 13C is a diagram showing a magnitude and direction of the leakage current Ixb with respect to the length direction in the cold-cathode tubes during a period tb shown in FIG. 13A.

DETAILED DESCRIPTION OF THE INVENTION

Suitable embodiments of the present invention are described with reference to the drawings as follows.

First Embodiment

Figure 1:
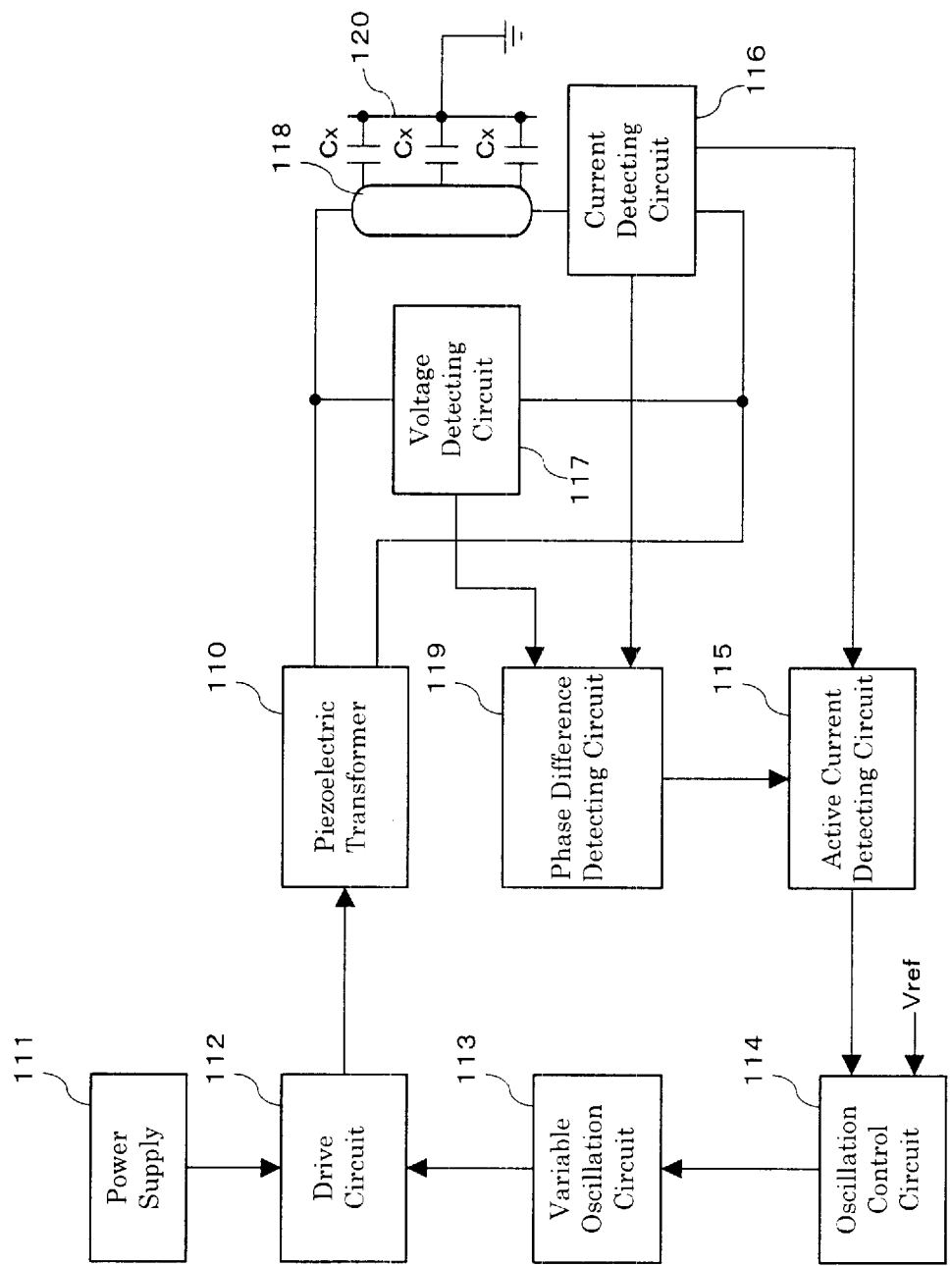
FIG. 1 is a block diagram showing a configuration example of a drive for a piezoelectric transformer according to a first embodiment of the present invention.

FIG. 1 is a block diagram showing a configuration example of a drive for a piezoelectric transformer according to a first embodiment of the present invention.

Figure 2:
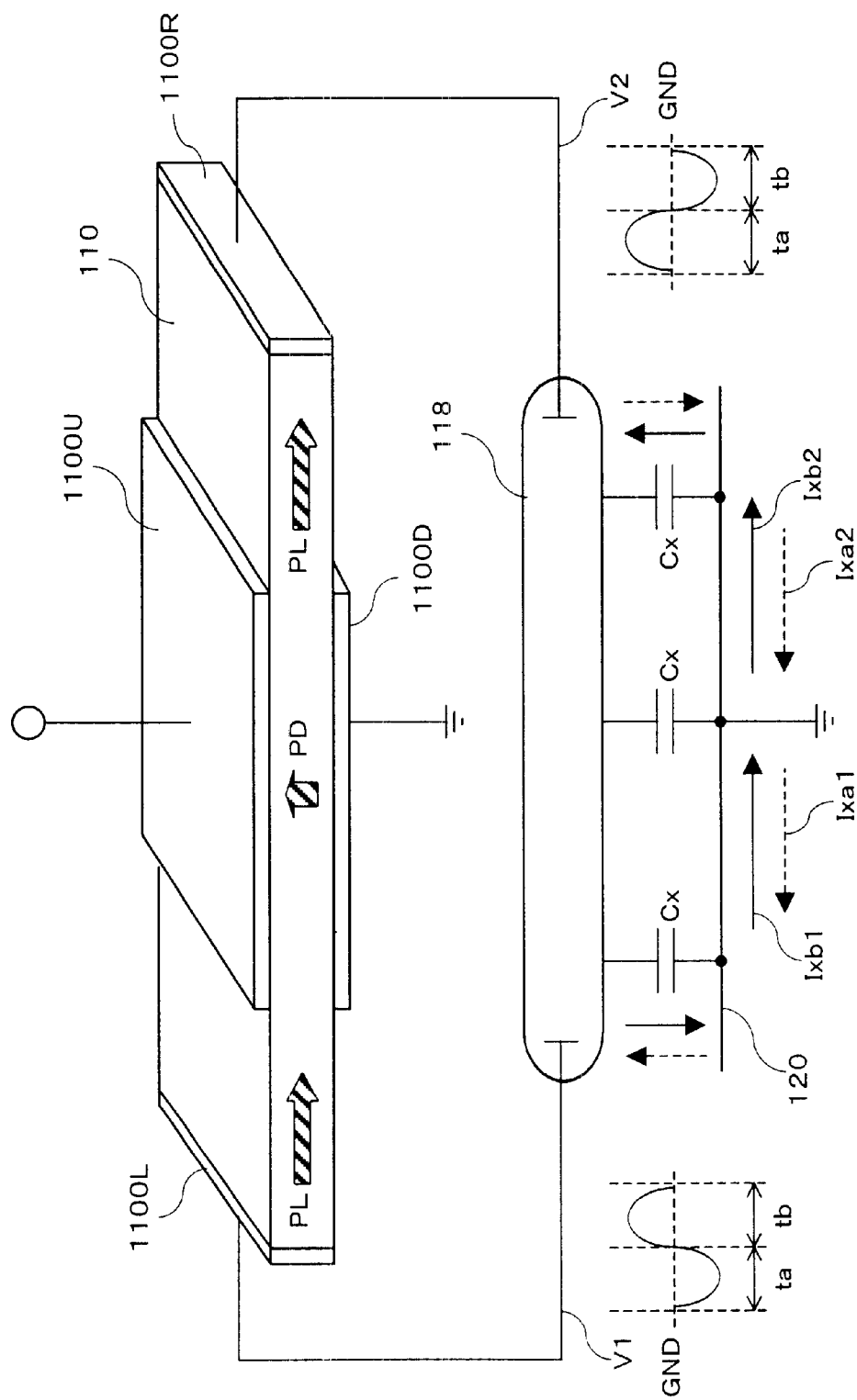
FIG. 2 is a schematic diagram showing reactive currents Ixa and Ixb during periods ta and tb caused by stray capacitance Cx when voltage is applied to a cold-cathode tube from a piezoelectric transformer.

FIG. 2 is a schematic diagram showing a state of connection between a piezoelectric transformer 110 shown in FIG. 1 and a cold-cathode tube 118 as a load, and reactive currents Ixa and Ixb caused by stray capacitance Cx.

As shown in FIG. 2, the piezoelectric transformer 110 includes a rectangular plate formed of a piezoelectric material such as lead zirconate titanate (PZT) processed in a rectangular form, input electrodes 1100U and 1100D formed in the vicinity of the center of the rectangular plate, and output electrodes 1100L and 1100R provided on end faces of the rectangular plate, respectively. A driving part of the piezoelectric transformer 110 is polarized with the input electrodes 1100U and 1100D in the thickness direction. A power generation part of the piezoelectric transformer 110 is polarized with the input electrodes 1100U and 1100D and the respective output electrodes 1100L and 1100R. In the piezoelectric transformer 110, when an AC voltage with a half-wavelength oscillation mode is applied between the input electrodes 1100U and 1100D, the AC voltage is output from the two output electrodes 1100L and 1100R formed on the end faces as voltages whose phases are different from each other by 180°.

As shown in FIG. 2, output voltages from the piezoelectric transformer having different phases from each other by 180° obtained through multiplication of an input voltage by a step-up ratio are applied to respective input terminals of the cold-cathode tube 118. Generally, the cold-cathode tube 118 has stray capacitance Cx caused by a reflector 120 or the like. In such a case, when plus and minus voltages are applied to ends of the cold-cathode tube 118, respectively, currents Ixa2 and Ixb1 flow out from the cold-cathode tube 118 to the reflector 120 on a higher-voltage side (the side to which a voltage V2 is applied during a period ta, the side to which a voltage V1 is applied during a period tb) of the cold-cathode tube 118, and currents Ixa1 and Ixb2 flow into the cold-cathode tube 118 from the reflector 120 on a lower-voltage side (the side to which a voltage V1 is applied during a period ta, the side to which a voltage V2 is applied during a period tb). Consequently, an output current from the piezoelectric transformer 110 includes a current Ia (an active current) contributing to emission by the cold-cathode tube 118 and a current (a reactive current Ix) flowing in the stray capacitance Cx formed between the cold-cathode tube 118 and the reflector 120.

As a result, when the luminance of the cold-cathode tube 118 is intended to be kept constant, it is necessary to detect only the active current Ia contributing to the emission by the cold-cathode tube 118 and to feedback it.

In FIG. 1, numeral 113 is a variable oscillation circuit for producing a variable-frequency voltage signal. An output signal from the variable oscillation circuit 113 generally is a voltage signal with a pulse waveform. A drive circuit 112 removes high frequency components from the output signal to convert it to an AC signal with a substantially sinusoidal waveform. The output signal from the variable oscillation circuit 113 is input to the drive circuit 112. An output signal from the drive circuit 112 is converted to a voltage and the voltage is amplified to a sufficient level to drive the piezoelectric transformer 110 and then is input to the primary side electrode 1100U of the piezoelectric transformer 110. In this case, the piezoelectric transformer with the configuration shown in FIG. 2 is used as the piezoelectric transformer 110.

The output voltages stepped up by the piezoelectric effect of the piezoelectric transformer 110 are output from the secondary side electrodes 1100L and 1100R. Two high voltages whose phases are different from each other by 180° output from the secondary side electrodes 1100L and 1100R are applied to two input terminals of the cold-cathode tube 118. Thus, the cold-cathode tube 118 emits light.

During emission by the cold-cathode tube 118, plus and minus voltages whose phases are different from each other by 180° are applied alternately from the two input terminals. An output signal from a current detecting circuit 116 for detecting a current flowing in the cold-cathode tube 118 and an output signal from a voltage detecting circuit 117 for detecting the voltage applied to the respective ends of the cold-cathode tube 118 are supplied to a phase difference detecting circuit 119 for detecting the phase difference between the voltage and current in the cold-cathode tube 118. An output signal from the phase difference detecting circuit 119 and the output signal from the current detecting circuit 116 are supplied to an active current detecting circuit 115 and thus an active current flowing in the cold-cathode tube 118 is detected.

An output signal from the active current detecting circuit 115 is supplied to one input terminal of an oscillation control circuit 114 and is compared with a reference voltage Vref supplied to the other input terminal of the oscillation control circuit 114. According to the comparison result, the oscillating frequency of the variable oscillation circuit 113 is controlled so that a constant active current flows in the cold-cathode tube 118.

The oscillation control circuit 114 controls the variable oscillation circuit 113 so that the oscillating frequency varies in a direction apart from the resonance frequency of the piezoelectric transformer 110 when the active current flowing in the cold-cathode tube 118 exceeds a set value determined depending on the reference voltage Vref. On the other hand, the oscillation control circuit 114 controls the variable oscillation circuit 113 so that the oscillating frequency approaches the resonance frequency of the piezoelectric transformer 110 when the active current becomes lower than the set value. As described above, the driving of the piezoelectric transformer 110 is controlled by a self-exciting system allowing an active current flowing in the cold-cathode tube 118 to be constant, so that the cold-cathode tube 118 can emit light stably even when the load on the cold-cathode tube 118 varies or the characteristics of the piezoelectric transformer 110 vary depending on temperatures.

Figure 3:
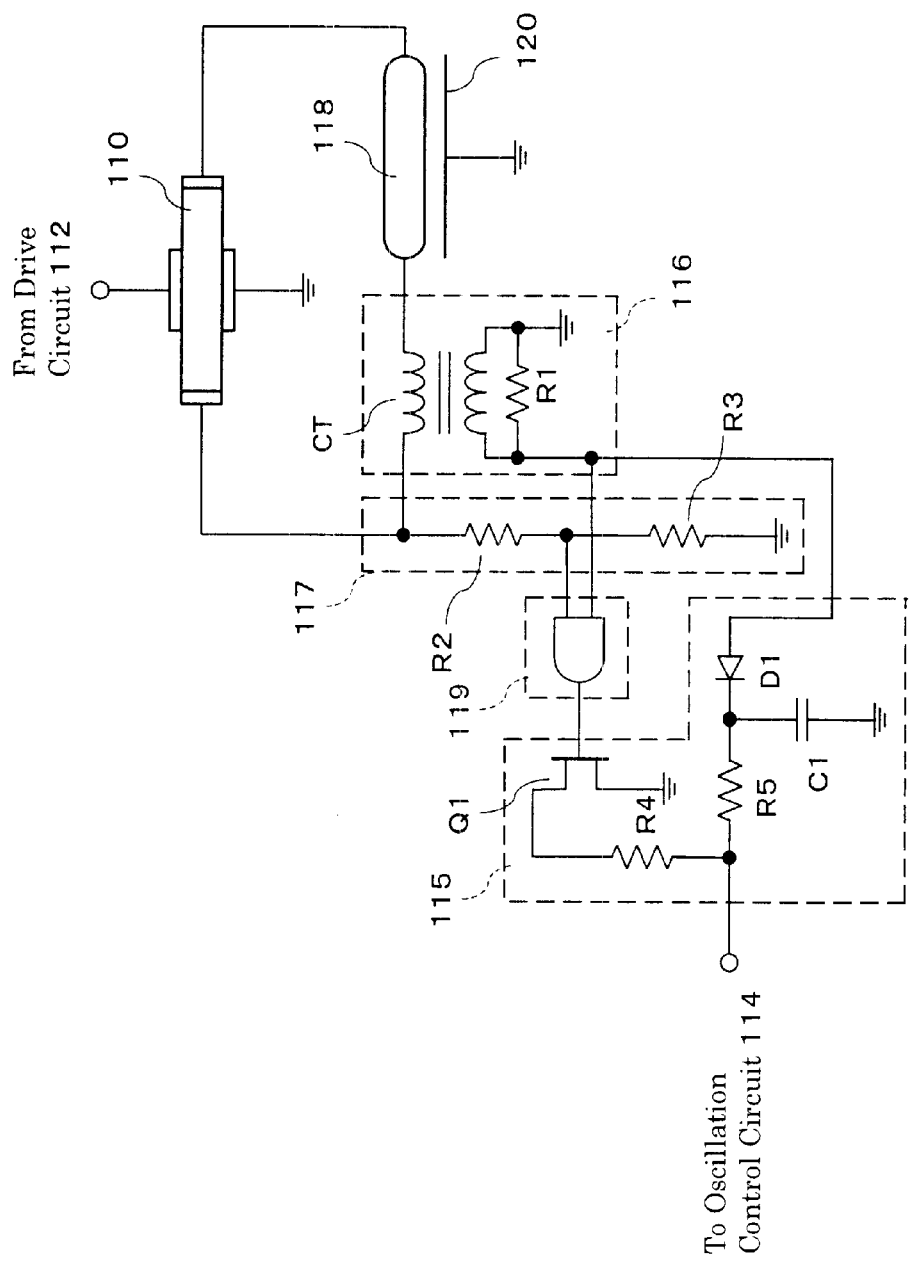
FIG. 3 is a circuit diagram showing a specific configuration example periphery of a drive circuit 112 shown in FIG. 1.

FIG. 3 is a circuit diagram showing a specific configuration example of the periphery of the drive circuit 112 shown in FIG. 1. In FIG. 3, the current detecting circuit 116 includes a current transformer CT and a resistance R1. The current transformer CT includes a primary winding with one end connected to the piezoelectric transformer 110 and the other end connected to the cold-cathode tube 118. The resistance R1 is connected between ends of a secondary winding of the current transformer CT as a load for current detection.

A current signal detected by the secondary winding of the current transformer CT is supplied to one input terminal of an AND gate included in the phase difference detecting circuit 119. A signal of a voltage obtained through division by resistances R2 and R3 included in the voltage detecting circuit 117 is supplied to the other input terminal of the AND gate. In this case, the output voltage from the piezoelectric transformer 110 is used for the detection of the phase difference between an output voltage and an output current. Therefore, the absolute value of the output voltage is not required. The resistances R2 and R3 divide the output voltage to an input threshold level of the AND gate.

The active current detecting circuit 115 includes a peak hold circuit, a switching element Q1, and a resistance R4. The peak hold circuit includes a diode D1, a capacitor C1, and a resistance R5. A current signal detected by the secondary winding of the current transformer CT is supplied to the peak hold circuit to be used for the detection of an absolute value of the current.

An output signal from the AND gate is input to the switching element Q1 to turn on and off the switching element Q1 according to the input levels of the voltage signal and the current signal, i.e. according to the phase difference therebetween. Thus, the peak hold circuit detects only an active current component of the current signal.

In the present embodiment, the piezoelectric transformer was formed with piezoelectric ceramic such as PZT. However, output voltages whose phases are different from each other by 180° also can be obtained using a single crystal material such as $LiNbO_3$ or the like as long as the material has piezoelectricity.

The piezoelectric transformer is not limited to those with a half-wavelength oscillation mode as shown in FIG. 2. The same effects as described above can be obtained with another piezoelectric transformer as long as the piezoelectric transformer outputs voltages whose phases are different from each other by 180° and inputs voltages to respective ends of a cold-cathode tube.

In addition, even when two cold-cathode tubes are connected as a load on a piezoelectric transformer, the same effects as described above can be obtained by the following process: a voltage applied to the two cold-cathode tubes and a current flowing in the cold-cathode tubes are detected; using the phase difference between the voltage and the current, only an active current component contained in the output current from the piezoelectric transformer is detected; and the detection result is used for luminance control.

Second Embodiment

Figure 4:
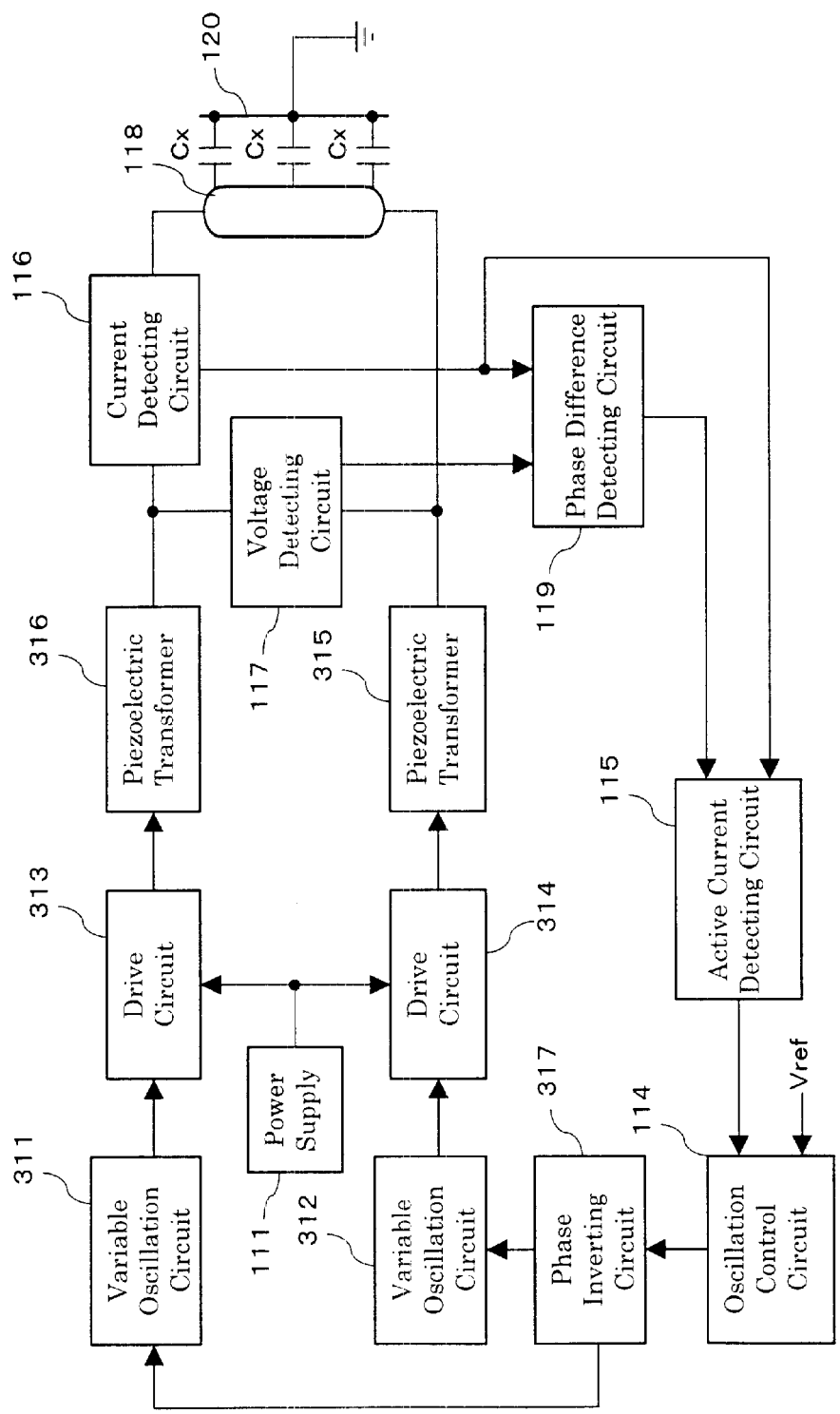
FIG. 4 is a block diagram showing a configuration example of a drive for piezoelectric transformers according to a second embodiment of the present invention.

FIG. 4 is a block diagram showing a configuration example of a drive for piezoelectric transformers according to a second embodiment of the present invention.

In FIG. 4, piezoelectric transformers 315 and 316 are made of a piezoelectric material having piezoelectricity such as PZT or the like. In each piezoelectric transformer, a voltage applied to its primary side electrode is multiplied by a step-up ratio and then the voltage thus obtained is output from its secondary side electrode.

To the two piezoelectric transformers 315 and 316 shown in FIG. 4, input voltages whose phases are different from each other by 180° are applied by a phase inverting circuit 317, respectively. As a result, output voltages whose phases are different from each other by 180° are output from the piezoelectric transformers 315 and 316 and are input to input terminals of a cold-cathode tube 118, respectively. The present embodiment is different from the first embodiment in that the cold-cathode tube 118 is driven with two piezoelectric transformers, and the other controls in the present embodiment are carried out in the same manner as in the first embodiment.

Similarly in the case of driving according to the present embodiment, the cold-cathode tube 118 generally has stray capacitance Cx caused by a reflector 120 or the like. Hence, when plus and minus voltages are applied alternately to ends of the cold-cathode tube 118, a current flows out to the reflector 120 from the cold-cathode tube 118 on a higher-voltage side, and a current flows into the cold-cathode tube 118 from the reflector 120 on a lower-voltage side.

Thus, an output current from the piezoelectric transformers 315 and 316 includes a current Ia (an active current) contributing to emission by the cold-cathode tube 118 and a current (a reactive current Ix) flowing in the stray capacitance Cx formed between the cold-cathode tube 118 and the reflector 120.

As a result, when the luminance of the cold-cathode tube 118 is intended to be kept constant, it is necessary to detect only the active current Ia contributing to the emission by the cold-cathode tube 118 and to feedback it.

In FIG. 4, numerals 311 and 312 are variable oscillation circuits for producing variable-frequency voltage signals. Output signals from the variable oscillation circuits 311 and 312 generally are voltage signals with pulse waveforms. Drive circuits 313 and 314 remove high frequency components from the output signals to convert them to AC signals with a substantially sinusoidal waveform. The output signals from the drive circuits 314 and 313 are converted to voltages and the voltages are amplified to a sufficient level to drive the piezoelectric transformers 315 and 316 and then are input to primary side electrodes of the piezoelectric transformers 315 and 316, respectively. In this case, the respective voltages input to the two piezoelectric transformers 315 and 316 have the same amplitude and are different in phase from each other by 180°.

Output voltages stepped up by the piezoelectric effect of the piezoelectric transformers 315 and 316 are output from their secondary side electrodes. With input voltages whose phases are different from each other by 180°, voltages whose phases are different from each other by 180° are output from piezoelectric transformers with the same configuration. The two high voltages output from the secondary side electrodes are applied to two input terminals of the cold-cathode tube 118. Thus, the cold-cathode tube 118 emits light.

During emission by the cold-cathode tube 118, plus and minus voltages whose phases are different from each other by 180° are applied alternately from the two input terminals. An output signal from a current detecting circuit 116 for detecting a current flowing in the cold-cathode tube 118 and an output signal from a voltage detecting circuit 117 for detecting the voltage applied to the respective ends of the cold-cathode tube 118 are supplied to a phase difference detecting circuit 119 for detecting the phase difference between the voltage and current in the cold-cathode tube 118. An output signal from the phase difference detecting circuit 119 and the output signal from the current detecting circuit 116 are supplied to an active current detecting circuit 115 and thus an active current flowing in the cold-cathode tube 118 is detected.

An output signal from the active current detecting circuit 115 is supplied to one input terminal of an oscillation control circuit 114. The output signal is compared with a reference voltage Vref supplied to the other input terminal of the oscillation control circuit 114. According to the comparison result, the oscillating frequencies of the variable oscillation circuits 311 and 312 are controlled so that a constant active current flows in the cold-cathode tube 118. An output signal from the oscillation control circuit 114 is input to the phase inverting circuit 317 and then output signals from the phase inverting circuit 317, which have different phases from each other by 180°, are input to the variable oscillation circuits 311 and 312, respectively.

The oscillation control circuit 114 controls the variable oscillation circuits 312 and 311 so that the oscillating frequencies vary in a direction apart from the resonance frequencies of the piezoelectric transformers 315 and 316 when the active current flowing in the cold-cathode tube 118 exceeds a set value determined depending on the reference voltage Vref. On the other hand, the oscillation control circuit 114 controls the variable oscillation circuits 312 and 311 so that the oscillating frequencies approach the resonance frequencies of the piezoelectric transformers 315 and 316 when the active current becomes lower than the set value. As described above, the driving of the piezoelectric transformers 315 and 316 is controlled by the self-exciting system allowing the active current flowing in the cold-cathode tube 118 to be constant, so that the cold-cathode tube 118 can emit light stably even when the load on the cold-cathode tube 118 varies or the characteristics of the piezoelectric transformers 315 and 316 vary depending on temperatures.

Figure 5:
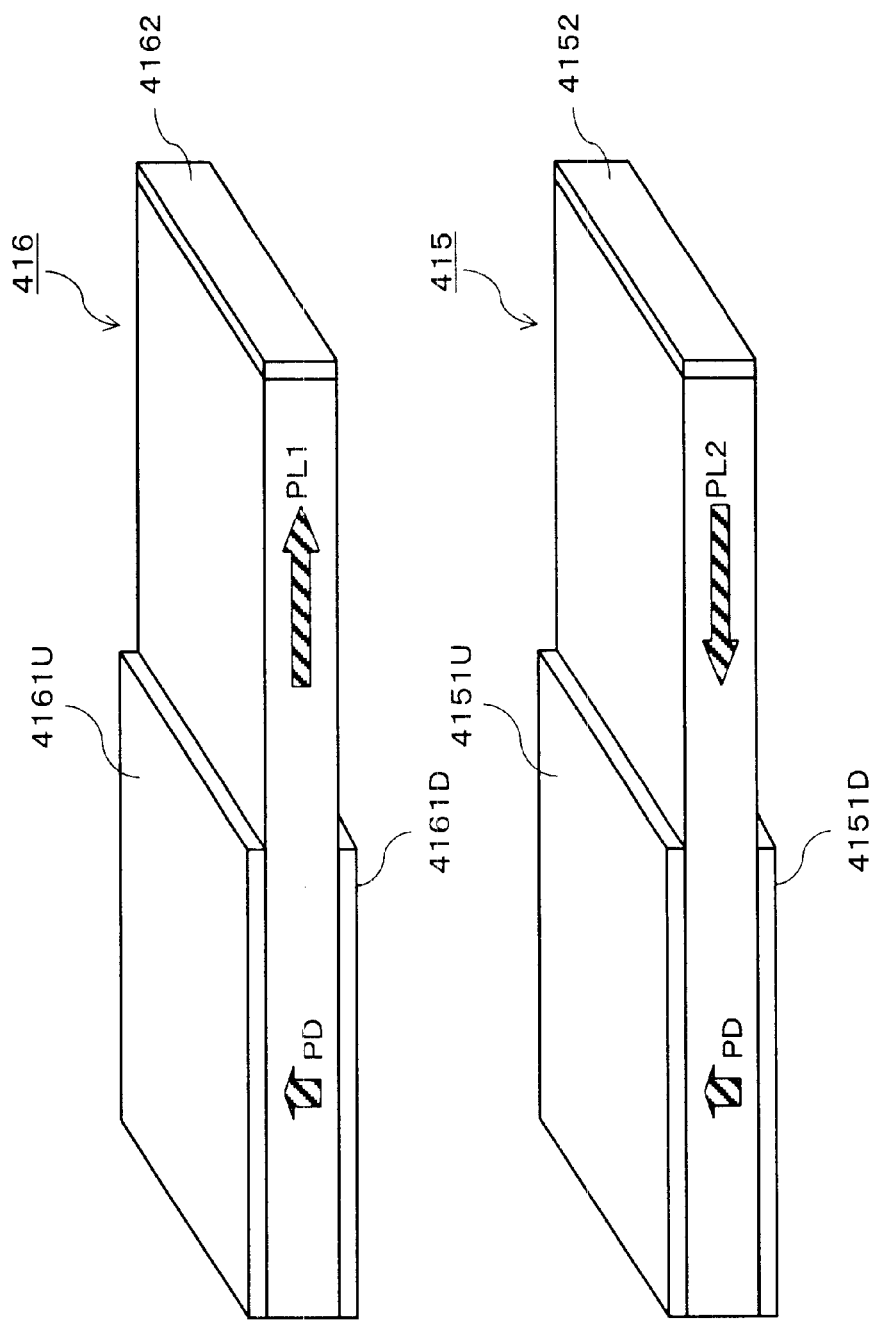
FIG. 5 is a perspective view of piezoelectric transformers used in another drive according to the second embodiment of the present invention.

In the description above, since two piezoelectric transformers with the same configuration were used, voltages whose phases are different from each other by 180° were applied to the input terminals of the piezoelectric transformers, respectively. However, as a modified example of the present embodiment, piezoelectric transformers with different polarization structures can be used. In this case, as shown in FIG. 5, one piezoelectric transformer 416 has input side electrodes 4161U and 4161D and an output side electrode 4162, and the other piezoelectric transformer 415 has input side electrodes 4151U and 4151D and an output side electrode 4152. The piezoelectric transformers 416 and 415 are polarized in the same direction PD in the thickness direction and in directions PL1 and PL2 opposite to the direction PL1 in the longitudinal direction, respectively. Thus, output voltages whose phases are different from each other by 180° can be obtained from input voltages with the same phase.

Figure 6:
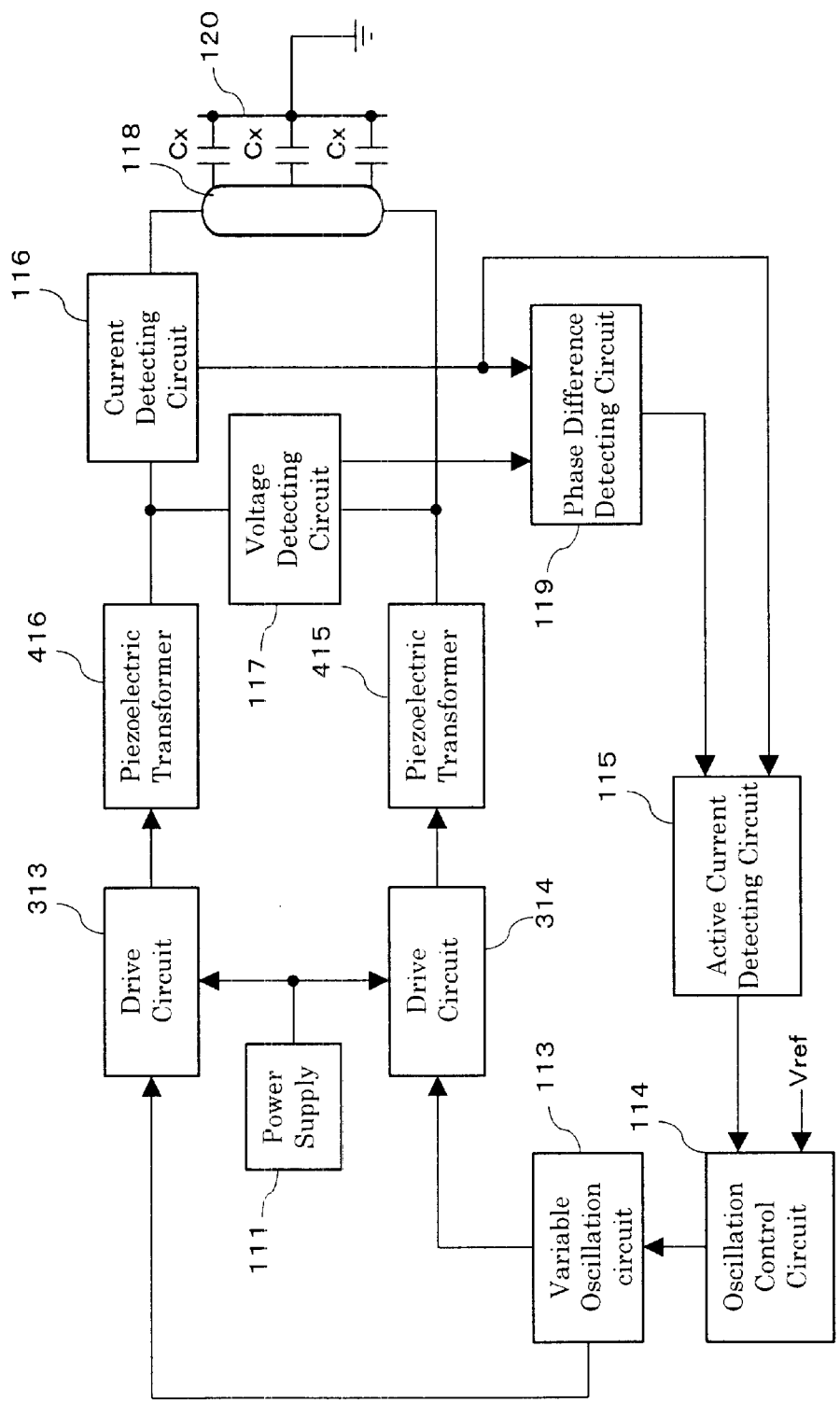
FIG. 6 is a block diagram showing a configuration example of another drive with the piezoelectric transformers shown in FIG. 5.

Consequently, as in a drive for piezoelectric transformers shown in FIG. 6, the phase inverting circuit 317 (FIG. 4) can be omitted and one variable oscillation circuit 113 to be shared between two piezoelectric transformers 415 and 416 can be used instead of the two variable oscillation circuits 311 and 312 (FIG. 4).

In the present embodiment, the piezoelectric transformers were formed with piezoelectric ceramic such as PZT. However, output voltages whose phases are different from each other by 180° also can be obtained using a single crystal material such as $LiNbO_3$ or the like as long as the material has piezoelectricity.

The same effects as described above can be obtained with other piezoelectric transformers as long as they input a voltage to each of the ends of a cold-cathode tube.

In addition, even when two cold-cathode tubes are connected as a load on the piezoelectric transformers, the same effects as described above can be obtained by the following process: a voltage applied to the two cold-cathode tubes and a current flowing in the cold-cathode tubes are detected; using the phase difference between the voltage and current, only an active current component contained in the output current from the piezoelectric transformers is detected; and according to the detection result, the luminance is controlled to be constant.

Third Embodiment

Figure 7:
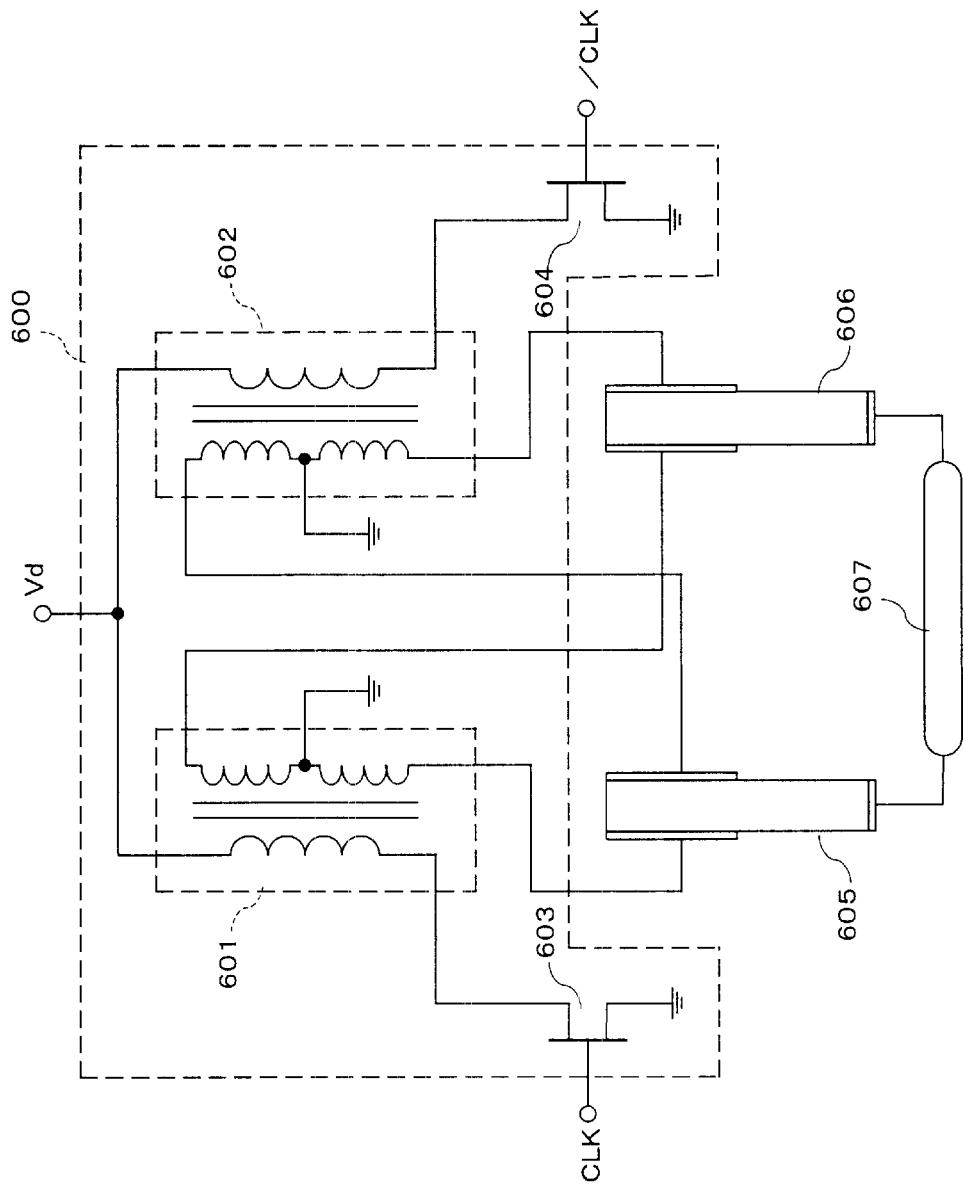
FIG. 7 is a configuration diagram showing a drive circuit 600 and its periphery in a drive for piezoelectric transformers according to a third embodiment of the present invention.

FIG. 7 is a configuration diagram of a drive circuit and its periphery in a drive for piezoelectric transformers according to a third embodiment of the present invention.

In FIG. 7, numerals 605 and 606 indicate piezoelectric transformers. The piezoelectric transformers 605 and 606 have a resonance characteristic as other piezoelectric elements do. In each piezoelectric transformer, when an AC current with a frequency close to the resonance frequency is input to its primary electrode, an output voltage multiplied by a step-up ratio due to the piezoelectric effect is output from its secondary side electrode. However, frequency components other than the resonance frequency are lost in the piezoelectric transformers 605 and 606, are converted to heat, or cause unwanted stresses, resulting in deterioration in reliability. Thus, it is desirable to drive the piezoelectric transformers 605 and 606 with a sine wave with a frequency close to the resonance frequency as far as possible.

As described in the second embodiment, however, in a unit using two piezoelectric transformers, each piezoelectric transformer requires one drive circuit.

In such a case, as shown in FIG. 7, a drive circuit 600 is configured with a pair of FETs 603 and 604 and a pair of step-up transformers 601 and 602.

In the drive circuit 600 shown in FIG. 7, a center tap is provided in the middle of each secondary side winding of the step-up transformers 601 and 602 to be grounded, and voltages whose phases are different from each other by 180° are generated from the two terminals of each secondary side winding and are applied to the respective piezoelectric transformers 605 and 606. In this case, the inductances of the secondary side windings of the step-up transformers 601 and 602 are set to allow the voltages to resonate at a desired frequency with consideration given to the primary side capacitance of the piezoelectric transformers 605 and 606.

Rectangular wave signals CLK and /CLK with phases opposite to each other are input to gate terminals of the pair of FETs 603 and 604, respectively. When the FET 603 is in an on state, the FET 604 is in an off state. When the FET 603 or 604 is in the on state, a current flows to the primary side winding of the corresponding step-up transformer 601 or 602 from a power source Vd and thus energy is stored. When the FET in the on state is changed to the off state, the energy stored in the inductor is converted to a voltage and the voltage is output to the corresponding piezoelectric transformer 605 or 606 from the secondary side winding.

Thus, the piezoelectric transformers 605 and 606 are driven by the pair of FETs 603 and 604 and the pair of step-up transformers 601 and 602 using a sine-wave voltage. Voltages whose phases are different from each other by 180° are output from the output terminals of the piezoelectric transformers 605 and 606 and a cold-cathode tube 607 is driven with signals of the voltages.

Figure 8:
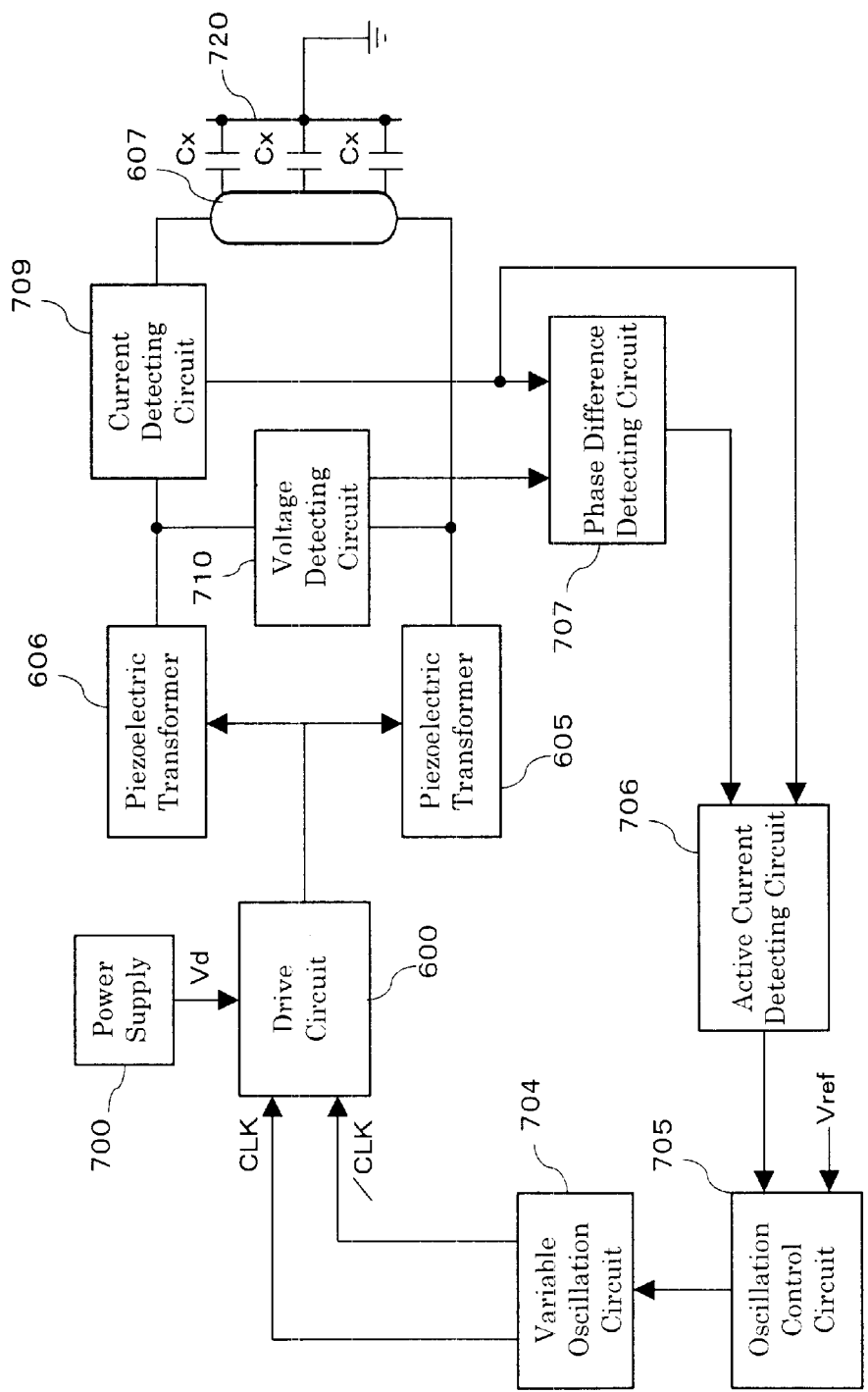
FIG. 8 is a block diagram showing a configuration example of a drive for piezoelectric transformers with the drive circuit configuration shown in FIG. 7.
Figure 9:
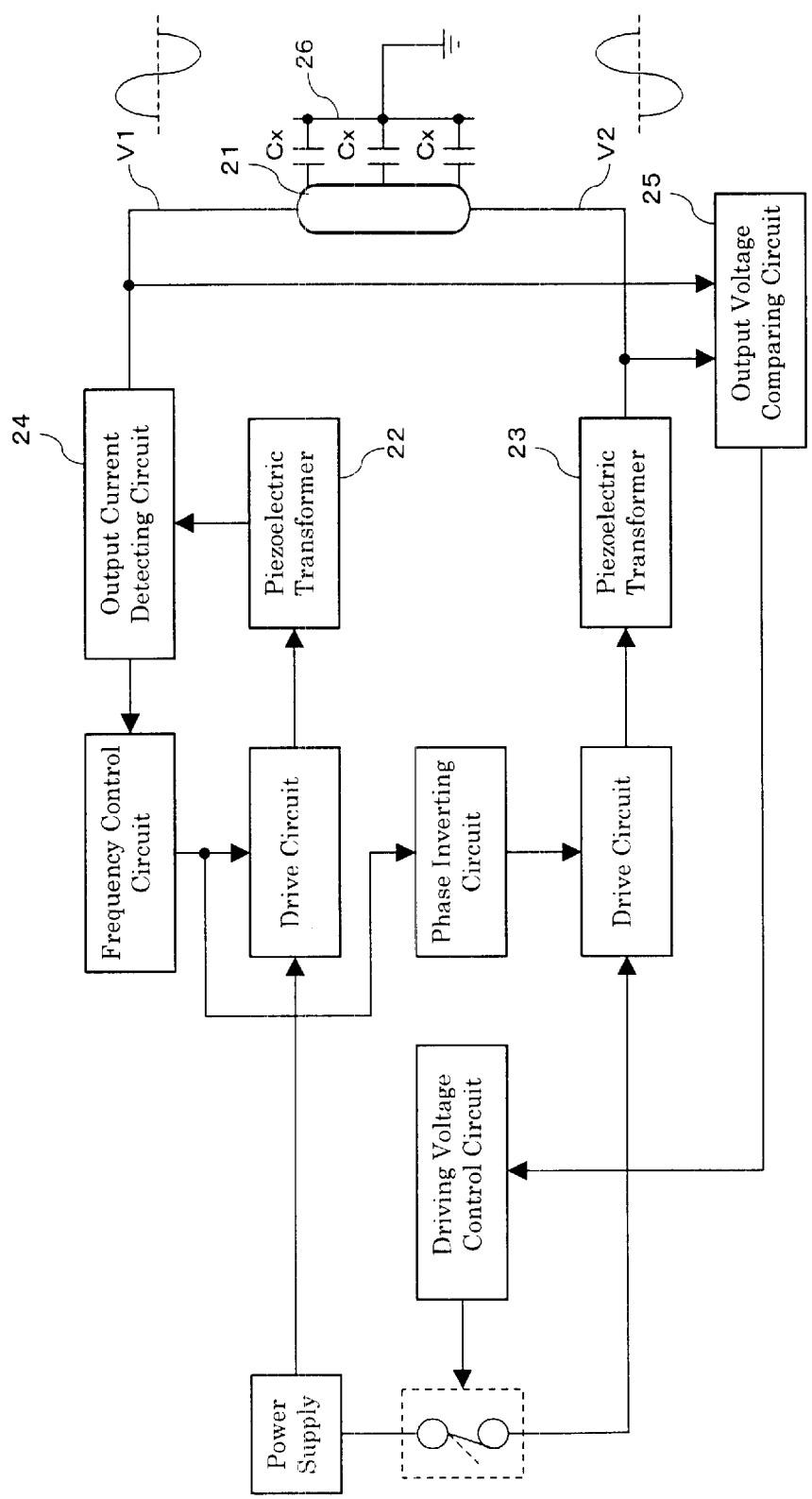
FIG. 9 is a block diagram showing a configuration of a conventional drive for piezoelectric transformers.
Figure 10:
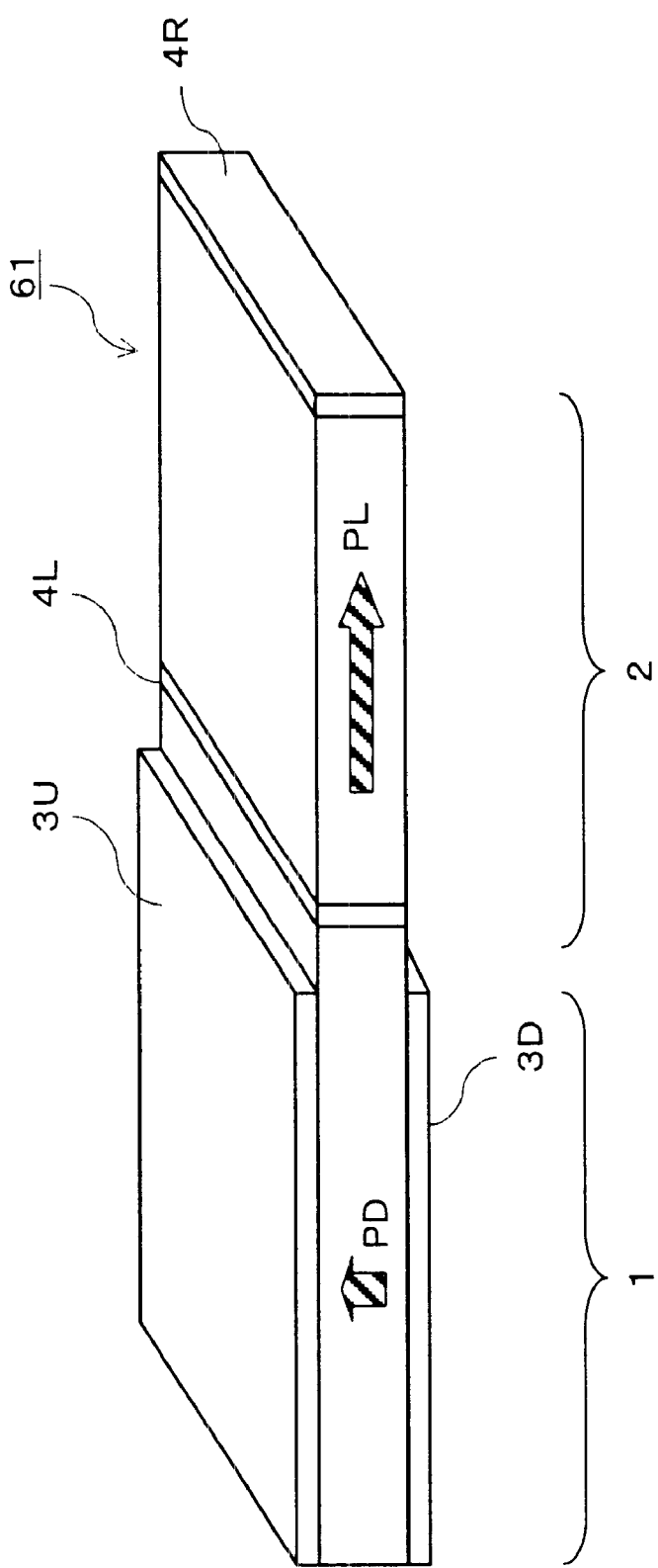
FIG. 10 is a perspective view showing a configuration of a conventional piezoelectric transformer.
Figure 11:
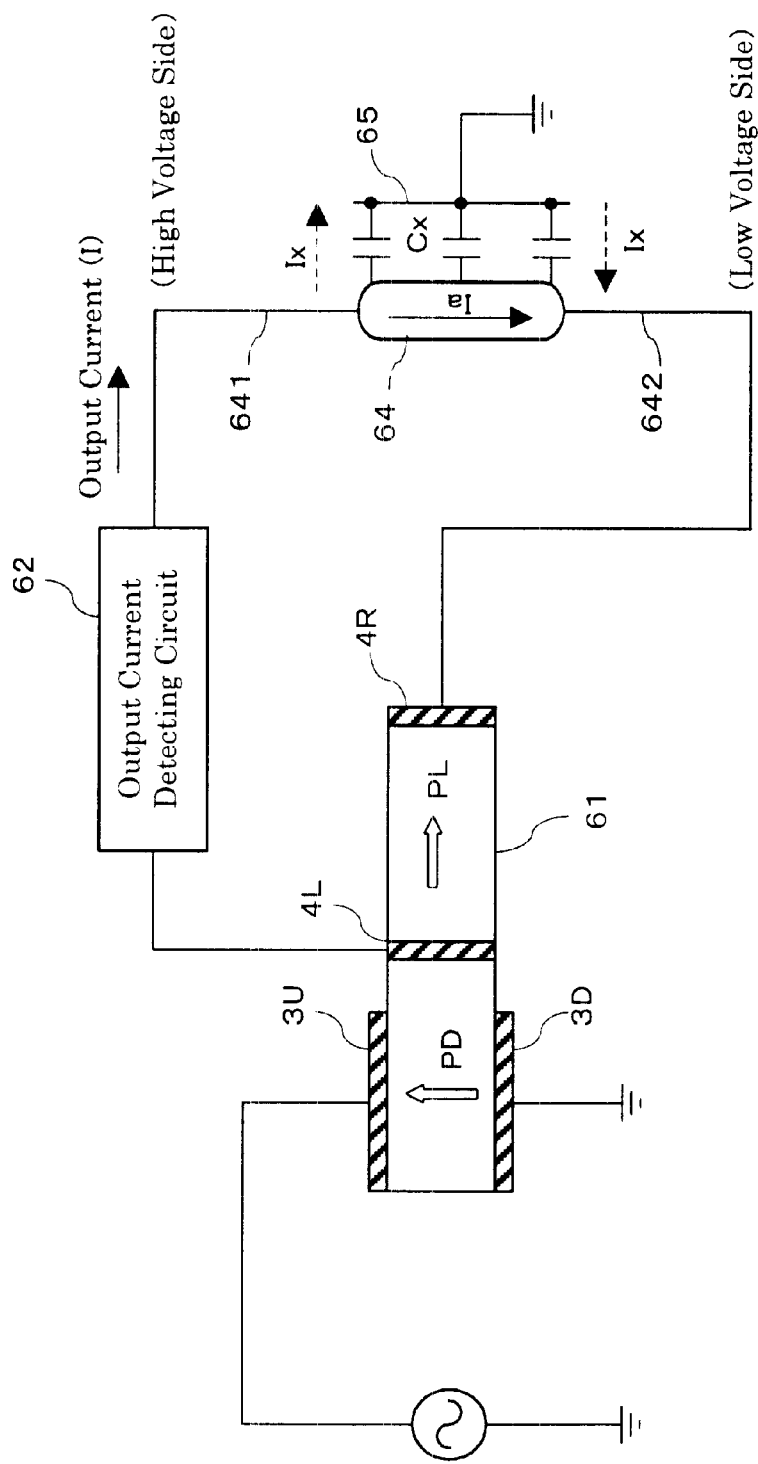
FIG. 11 is a block diagram showing a conventional drive circuit for a piezoelectric transformer with the piezoelectric transformer shown in FIG. 10.
Figures 12A, 12B, 12C:
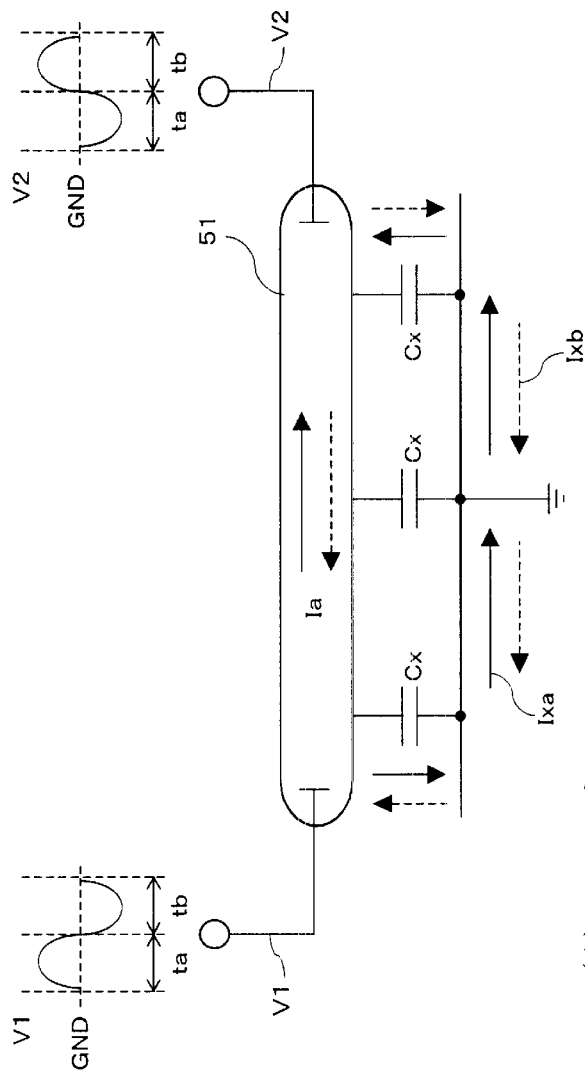
FIG. 12A is a schematic diagram showing leakage currents Ixa and Ixb caused by stray capacitance Cx when voltages whose phases are different from each other by 180° are applied to ends of one cold-cathode tube, respectively.
FIG. 12B is a diagram showing a magnitude and direction of the leakage current Ixa with respect to a length direction in the cold-cathode tube during a period ta shown in FIG. 12A.
FIG. 12C is a diagram showing a magnitude and direction of the leakage current Ixb with respect to the length direction in the cold-cathode be during a period tb shown in FIG. 12A.
Figure 14:
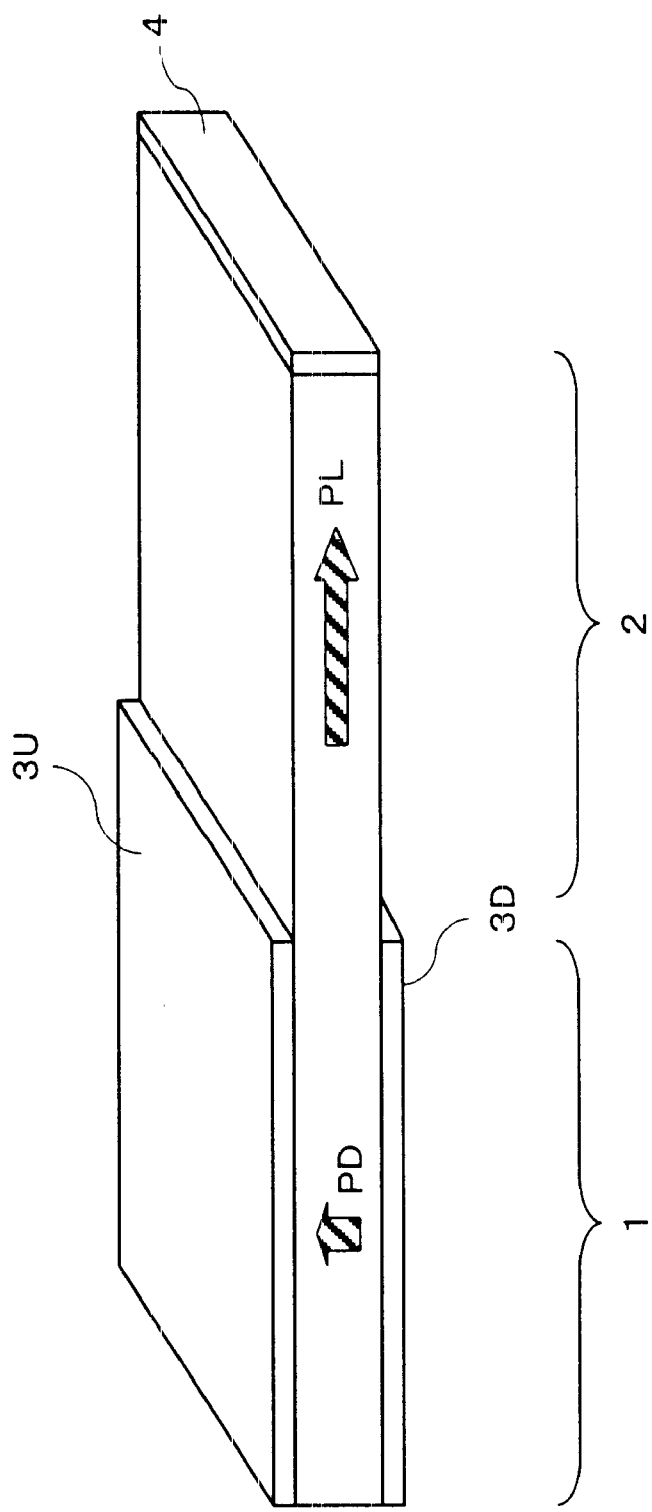
FIG. 14 is a perspective view showing a configuration of a conventional piezoelectric transformer.
Figure 15:
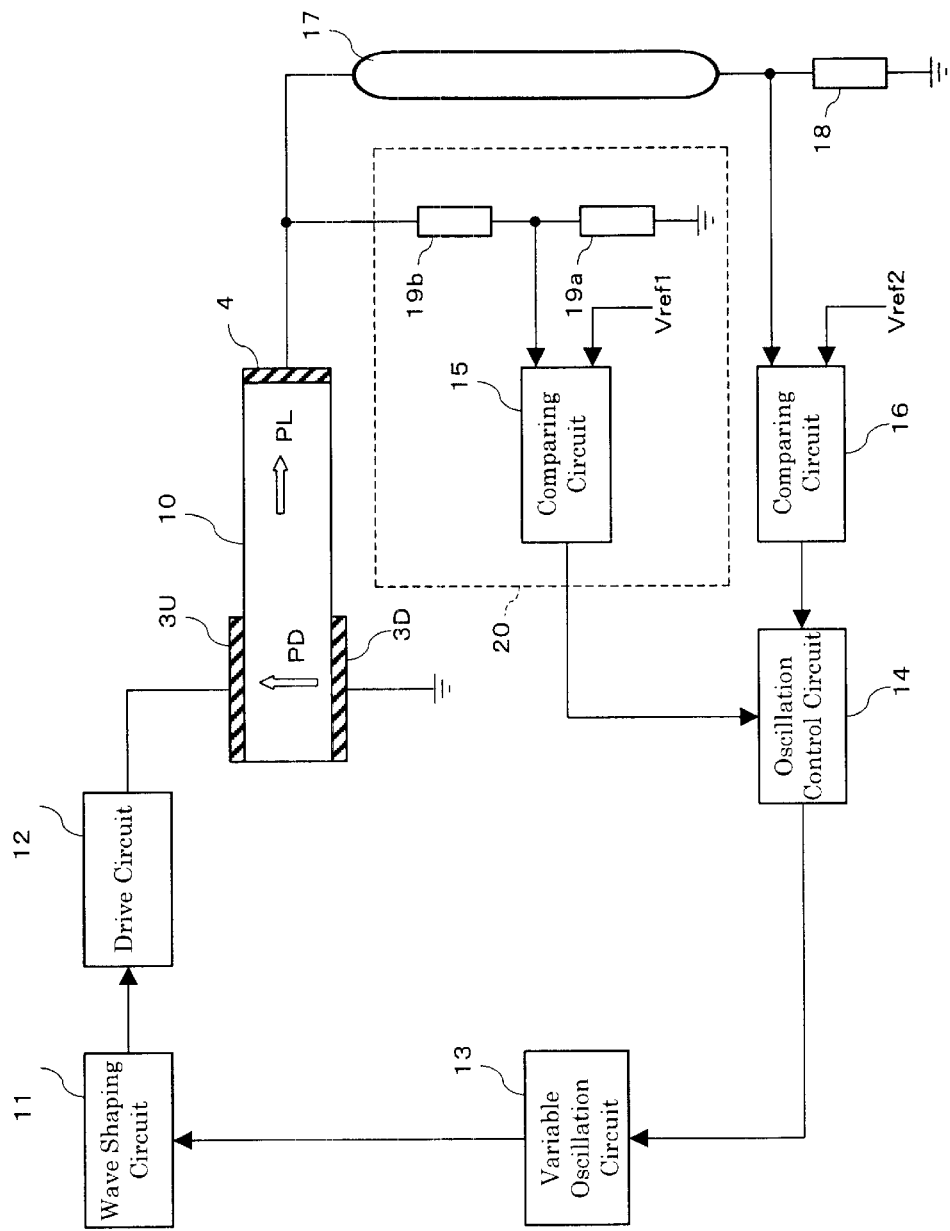
FIG. 15 is a block diagram showing a configuration of a conventional drive for a piezoelectric transformer.
Figure 16:
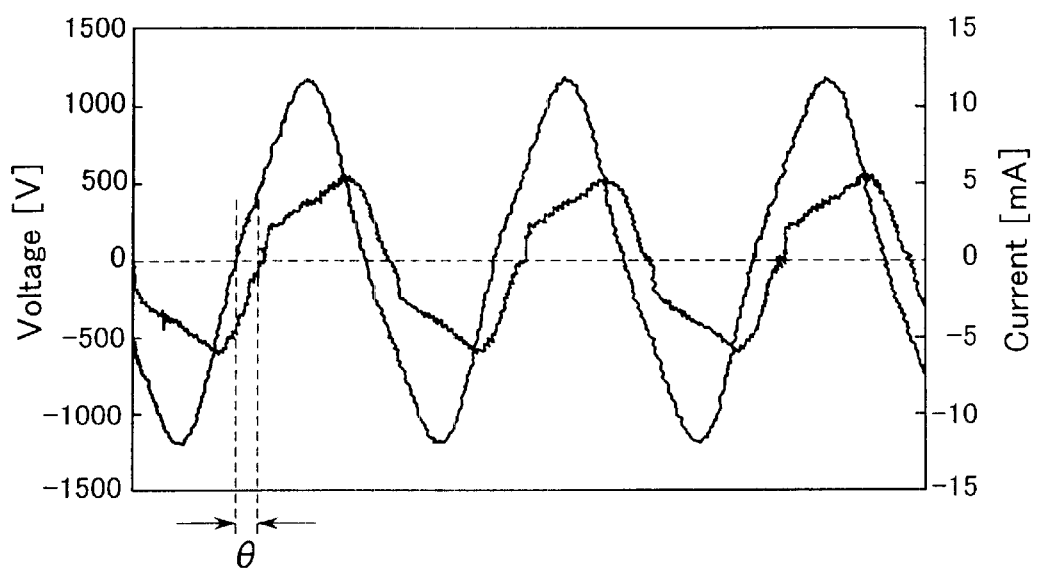
FIG. 16 is a graph showing waveforms of an output voltage and current of a piezoelectric transformer.

As in a drive for piezoelectric transformers shown in FIG. 8, when using the drive circuit 600 with the above-mentioned configuration, a drive circuit 600 can be shared between piezoelectric transformers 605 and 606 and hence, voltages with the same driving waveform can be applied to the two piezoelectric transformers 605 and 606 in driving the piezoelectric transformers. Accordingly, output voltages of the two piezoelectric transformers 605 and 606 can be made substantially equal and thus voltages to be applied to the cold-cathode tube 607 can be made substantially equal. In addition, there are effects of reducing the size of the drive for the piezoelectric transformers and reducing the number of parts, or the like.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method of driving a piezoelectric transformer, comprising:

stepping up a voltage input from a primary terminal of a piezoelectric transformer by using a piezoelectric effect and outputting a voltage stepped up by using the piezoelectric effect to two terminals of a cold-cathode tube from two secondary terminals of the piezoelectric transformer, detecting a phase difference between the voltage applied to the cold-cathode tube and a current flowing in the cold-cathode tube;

detecting an active current flowing in the cold-cathode tube based on the phase difference;

comparing the active current with a predetermined set value; and controlling driving of the piezoelectric transformer so that the active current flowing in the cold-cathode tube has a value equal to the predetermined set value.

2. The method of driving a piezoelectric transformer according to claim 1, wherein the cold-cathode tube comprises one or more cold-cathode tubes connected in series.

3. A method of driving piezoelectric transformers, comprising:

inputting a voltage from a primary terminal of a first piezoelectric transformer by using a piezoelectric effect and outputting a voltage stepped up by using the piezoelectric effect to one terminal of a cold-cathode tube from a secondary terminal of the first piezoelectric transformer;

inputting a voltage from a primary terminal of a second piezoelectric transformer by using the piezoelectric effect and outputting a voltage stepped up by using the piezoelectric effect to the other terminal of the cold-cathode tube from a secondary terminal of the second piezoelectric transformer;

detecting a phase difference between the voltage applied to the cold-cathode tube and a current flowing in the cold-cathode tube;

detecting an active current flowing in the cold-cathode tube based on the phase difference;

comparing the active current with a predetermined set value; and controlling driving of the first and second piezoelectric transformers so that the active current flowing in the cold-cathode tube has a value equal to the predetermined set value.

4. The method of driving piezoelectric transformers according to claim 3, wherein the cold-cathode tube comprises one or more cold-cathode tubes connected in series.

5. A drive for a piezoelectric transformer, comprising:

a piezoelectric transformer with a primary terminal and two secondary terminals, for inputting a voltage from the primary terminal by using a piezoelectric effect and outputting a voltage stepped up by using the piezoelectric effect from the two secondary terminals;

a drive circuit for driving the piezoelectric transformer;

a variable oscillation circuit for outputting a variable-frequency voltage to the drive circuit;

a cold-cathode tube with two terminals to which the voltage output from the two secondary terminals of the piezoelectric transformer is applied;

a current detecting circuit for detecting a current flowing in the cold-cathode tube;

a voltage detecting circuit for detecting the voltage applied to the cold-cathode tube;

a phase difference detecting circuit for detecting a phase difference between a current signal output from the current detecting circuit and a voltage signal output from the voltage detecting circuit;

an active current detecting circuit for detecting an active current flowing in the cold-cathode tube based on the current signal output from the current detecting circuit and the phase difference detected in the phase difference detecting circuit; and an oscillation control circuit for comparing the active current detected in the active current detecting circuit with a predetermined set value and controlling an oscillation frequency of the variable oscillation circuit so that the active current has a value equal to the predetermined set value.

6. A drive for piezoelectric transformers, comprising:

a first piezoelectric transformer for inputting a voltage from its primary terminal by using a piezoelectric effect and outputting a voltage stepped up by using the piezoelectric effect from its secondary terminal;

a second piezoelectric transformer for inputting a voltage from its primary terminal by using the piezoelectric effect and outputting a voltage stepped up by using the piezoelectric effect from its secondary terminal;

drive circuits for driving the first and second piezoelectric transformers with signals whose phases are different from each other by 180°, respectively;

variable oscillation circuits for outputting variable-frequency voltages to the drive circuits, respectively;

a cold-cathode tube with one terminal to which the voltage output from the secondary terminal of the first piezoelectric transformer is applied and the other terminal to which the voltage output from the secondary terminal of the second piezoelectric transformer is applied;

a current detecting circuit for detecting a current flowing in the cold-cathode tube;

a voltage detecting circuit for detecting the voltage applied to the cold-cathode tube;

a phase difference detecting circuit for detecting a phase difference between a current signal output from the current detecting circuit and a voltage signal output from the voltage detecting circuit;

an active current detecting circuit for detecting an active current flowing in the cold-cathode tube based on the current signal output from the current detecting circuit and the phase difference detected in the phase difference detecting circuit; and an oscillation control circuit for comparing the active current detected in the active current detecting circuit with a predetermined set value and controlling oscillation frequencies of the variable oscillation circuits so that the active current has a value equal to the predetermined set value.

7. A method of driving piezoelectric transformers, comprising:

inputting a voltage from a primary terminal of a first piezoelectric transformer by using a piezoelectric effect and outputting a voltage stepped up by using the piezoelectric effect to one terminal of a cold-cathode tube from a secondary terminal of the first piezoelectric transformer;

inputting, by using the piezoelectric effect, a voltage from a primary terminal of a second piezoelectric transformer having a phase identical with that of the voltage input to the first piezoelectric transformer, and outputting a voltage stepped up by using the piezoelectric effect having a different phase from that of the voltage output from the first piezoelectric transformer by 180° to the other terminal of the cold-cathode tube from a secondary terminal of the second piezoelectric transformer; and detecting a phase difference between the voltage applied to the cold-cathode tube and a current flowing in the cold-cathode tube;

detecting an active current flowing in the cold-cathode tube based on the phase difference;

comparing the active current with a predetermined set value;

controlling driving of the first and second piezoelectric transformers so that the active current flowing in the cold-cathode tube has a value equal to the predetermined set value; and allowing the cold-cathode tube to emit light.

8. A drive for piezoelectric transformers, comprising:

a first piezoelectric transformer for inputting a voltage from its primary terminal by using a piezoelectric effect and outputting a voltage stepped up by using the piezoelectric effect from its secondary terminal;

a second piezoelectric transformer for inputting, by using a piezoelectric effect, a voltage from its primary terminal having a phase identical with that of the voltage input to the first piezoelectric transformer and outputting, from its secondary terminal, a voltage stepped up by using the piezoelectric effect having a different phase from that of the voltage output from the first piezoelectric transformer by 180°;

drive circuits for driving the first and second piezoelectric transformers with signals whose phases are identical with each other, respectively;

a variable oscillation circuit for outputting a variable-frequency voltage to the drive circuits;

a cold-cathode tube with one terminal to which the voltage output from the secondary terminal of the first piezoelectric transformer is applied and the other terminal to which the voltage output from the secondary terminal of the second piezoelectric transformer is applied;

a current detecting circuit for detecting a current flowing in the cold-cathode tube;

a voltage detecting circuit for detecting the voltage applied to the cold-cathode tube;

a phase difference detecting circuit for detecting a phase difference between a current signal output from the current detecting circuit and a voltage signal output from the voltage detecting circuit;

an active current detecting circuit for detecting an active current flowing in the cold-cathode tube based on the current signal output from the current detecting circuit and the phase difference detected in the phase difference detecting circuit; and an oscillation control circuit for comparing the active current detected in the active current detecting circuit with a predetermined set value and controlling an oscillation frequency of the variable oscillation circuit so that the active current has a value equal to the predetermined set value.

* * * * *